(12) United States Patent
Konishi et al.

(10) Patent No.: US 9,704,834 B2
(45) Date of Patent: Jul. 11, 2017

(54) METHOD FOR MANUFACTURING LIGHT-EMITTING DEVICE

(71) Applicant: Sharp Kabushiki Kaisha, Osaka-shi, Osaka (JP)

(72) Inventors: Masahiro Konishi, Osaka (JP); Masayuki Itoh, Osaka (JP); Hiroshi Umeda, Osaka (JP); Kazuo Tamaki, Osaka (JP); Masanobu Okano, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/888,965

(22) PCT Filed: Apr. 15, 2014

(86) PCT No.: PCT/JP2014/060709
§ 371 (c)(1),
(2) Date: Nov. 4, 2015

(87) PCT Pub. No.: WO2014/192449
PCT Pub. Date: Dec. 4, 2014

(65) Prior Publication Data
US 2016/0079211 A1    Mar. 17, 2016

(30) Foreign Application Priority Data
May 28, 2013  (JP) .................. 2013-112289

(51) Int. Cl.
*H01L 25/075* (2006.01)
*H01L 33/00* (2010.01)
(Continued)

(52) U.S. Cl.
CPC .......... *H01L 25/0753* (2013.01); *H01L 24/97* (2013.01); *H01L 33/0095* (2013.01);
(Continued)

(58) Field of Classification Search
CPC . H01L 25/0753; H01L 33/486; H01L 33/502; H01L 33/54; H01L 2933/0041; H01L 2933/005
See application file for complete search history.

(56) References Cited

U.S. PATENT DOCUMENTS 5,998,925 A    12/1999   Shimizu et al.
6,650,044 B1   11/2003   Lowery
(Continued)

FOREIGN PATENT DOCUMENTS

JP    10-242513 A     9/1998
JP    2002-185048 A   6/2002
(Continued)

OTHER PUBLICATIONS

Official Communication issued in International Patent Application No. PCT/JP2014/060709, mailed on Jul. 8, 2014.

*Primary Examiner* — Fernando L Toledo
*Assistant Examiner* — Neil Prasad
(74) *Attorney, Agent, or Firm* — Keating & Bennett, LLP

(57) ABSTRACT

A method for manufacturing a light-emitting device of the present invention includes a step in which solid-state sealing resin (17) containing a phosphor (18) and the solid-state sealing resin (17) containing a phosphor (19) are arranged in recesses in package resin (14) having LED chips placed thereon, are thereafter melted by heating, and, in addition, are cured by heating.

4 Claims, 12 Drawing Sheets

(51) Int. Cl.
  *H01L 23/00* (2006.01)
  *H01L 33/48* (2010.01)
  *H01L 33/50* (2010.01)
  *H01L 33/54* (2010.01)

(52) U.S. Cl.
  CPC .......... *H01L 33/486* (2013.01); *H01L 33/502* (2013.01); *H01L 33/54* (2013.01); *H01L 2224/48091* (2013.01); *H01L 2224/48247* (2013.01); *H01L 2224/48257* (2013.01); *H01L 2924/0002* (2013.01); *H01L 2933/005* (2013.01); *H01L 2933/0033* (2013.01); *H01L 2933/0041* (2013.01)

(56) References Cited

U.S. PATENT DOCUMENTS

| | | |
|---|---|---|
| 2004/0097006 A1 | 5/2004 | Lowery |
| 2006/0043879 A1 | 3/2006 | Naitou |
| 2012/0052608 A1* | 3/2012 | Yoo ........................ H01L 33/505 438/27 |
| 2012/0112220 A1* | 5/2012 | West ........................ H01L 33/60 257/98 |
| 2012/0228646 A1 | 9/2012 | Kuo et al. |
| 2014/0267683 A1* | 9/2014 | Bibl ........................ H01L 51/50 348/87 |
| 2015/0021628 A1* | 1/2015 | Medendorp, Jr. ... H01L 33/0095 257/88 |
| 2015/0252258 A1 | 9/2015 | Konishi |
| 2015/0371585 A1* | 12/2015 | Bower ...................... G09G 3/32 345/1.1 |

FOREIGN PATENT DOCUMENTS

| | | |
|---|---|---|
| JP | 2005-123238 A | 5/2005 |
| JP | 2006-073656 A | 3/2006 |
| JP | 2006-324410 A | 11/2006 |
| WO | 2014/171268 A1 | 10/2014 |
| WO | 2014/171394 A1 | 10/2014 |
| WO | 2014/171492 A1 | 10/2014 |

* cited by examiner

F I G. 1 2

|  |  | LED1 | LED2 |
|---|---|---|---|
| CONFIGURATION (1) | PHOSPHOR | RED | GREEN |
|  | LED | BLUE | BLUE |
| CONFIGURATION (2) | PHOSPHOR | RED | GREEN |
|  | LED | BLUE (PEAK WAVELENGTH : 455nm) | BLUE (PEAK WAVELENGTH : 440nm) |
| CONFIGURATION (3) | PHOSPHOR | RED AND GREEN | YELLOW |
|  | LED | BLUE | BLUE |
| CONFIGURATION (4) | PHOSPHOR | NONE | RED |
|  | LED | GREEN | BLUE |

METHOD FOR MANUFACTURING LIGHT-EMITTING DEVICE

TECHNICAL FIELD

The present invention relates to a method for manufacturing a light-emitting device, and particularly relates to a method for manufacturing a light-emitting device for which resin sealing is required.

BACKGROUND ART

In recent years, LEDs having a long life span and low power consumption have become widespread as backlights for liquid crystal display devices and light sources for illumination devices. Such light sources obtain a desired emission color with LEDs having a plurality of different emission colors being combined and with single-color LEDs and phosphors being combined. For example, a white LED is generally configured with a blue LED and a phosphor being combined. In such a white LED, white light is obtained by a mixed color of blue light that is emitted from a blue LED chip and light that is emitted due to the phosphor being excited by this blue light.

For example, PTL 1 discloses a technology in which a blue LED chip and a YAG phosphor that is excited by light emitted from the blue LED chip and emits yellow fluorescence are used, and blue light emitted from the blue LED chip and yellow light emitted from the YAG phosphor serve as a mixed color for white light to be output.

Furthermore, although illumination light of a desired color may be obtained by mixing light from LEDs having a plurality of different emission colors, there are light-emitting devices that have a function to adjust the color of illumination light by adjusting the emission color of each LED.

CITATION LIST

Patent Literature

PTL 1: Japanese Unexamined Patent Application Publication, "Japanese Unexamined Patent Application Publication No. 10-242513 (published on Sep. 11, 1998)"

SUMMARY OF INVENTION

Technical Problem

In this regard, in a light-emitting device which uses an LED chip and a phosphor that is excited by light emitted from the LED chip and emits fluorescence, the LED chip is sealed by sealing resin and the phosphor is dispersed in this sealing resin. The sealing brought about by the sealing resin is implemented in package units.

Ordinarily, there is one LED chip in one package, and therefore, in the case of a light-emitting device that has a function to adjust the color of illumination light (color-adjustable light-emitting device), in order to adjust the emission color of the LEDs, it is necessary for sealing resin that contains a desired phosphor to be sealed in package units that are provided for each color.

In this way, in a conventional color-adjustable light-emitting device, it is necessary to prepare a package for each color and perform resin sealing for each package, and therefore a problem arises in that manufacturing takes time and the manufacturing cost increases.

Furthermore, although it is also feasible for a large area to be sealed in one go by implementing sheeting, it is not possible for sheeting to be applied for multiple cavities that are sealed with a plurality of types of sealing resin.

The present invention takes the aforementioned problems into consideration, and the objective thereof is to provide a method for manufacturing a light-emitting device with which, by performing resin sealing for packages for each color at the same time in a color-adjustable light-emitting device, the manufacturing time can be shortened and the manufacturing cost can be reduced compared to the case where resin sealing is performed for each package.

Solution to Problem

In order to solve the aforementioned problems, a method for manufacturing a light-emitting device according to an aspect of the present invention is a method for manufacturing a light-emitting device in which a plurality of chips are housed in a single package, characterized by including: a first arrangement step in which, in a cavity circuit substrate on which light-emitting elements are mounted in a plurality of cavities that open upward, solid-state first sealing resin containing a phosphor is arranged in one of at least two of the cavities that form one package; a second arrangement step in which solid-state second sealing resin containing a phosphor that is different from the phosphor contained in the first sealing resin is arranged in the other one of the at least two cavities; a melting step in which the first sealing resin arranged in the first arrangement step and the second sealing resin arranged in the second arrangement step are heated and thereby melted; and a curing step in which the first sealing resin and the second sealing resin melted in the melting step are cured.

Advantageous Effects of Invention

According to an aspect of the present invention, an effect is demonstrated in that the manufacturing time can be shortened and the manufacturing cost can be reduced compared to the case where resin sealing is performed for each package.

BRIEF DESCRIPTION OF DRAWINGS

FIG. 12 is a table depicting examples of combinations of sealing resin that can be applied in embodiments 1 and 2 of the present invention.

DESCRIPTION OF EMBODIMENTS

Embodiment 1

If an embodiment of the present invention were to be described, it would be as follows.
(Overview of LED Package Substrate)

FIG. 1(a) is a plan view of an LED package substrate 31, (b) is a cross-sectional view along line A-A' of (a), and (c) is a cross-sectional view along line B-B' of (a).

Figure 1:
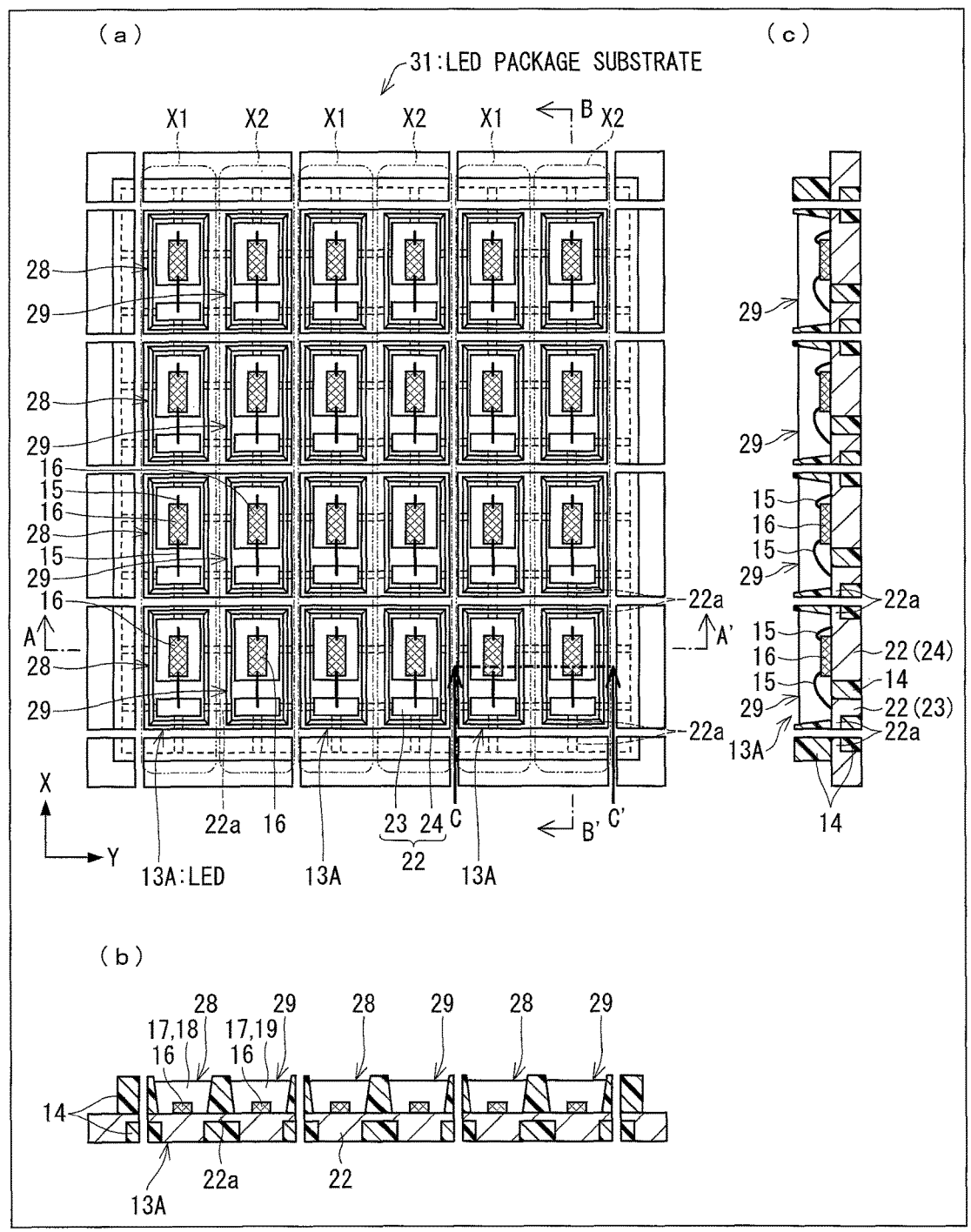
FIG. 1 depicts an LED package substrate according to embodiment 1 of the present invention, (a) is a plan view depicting a configuration of the LED package substrate, (b) is a cross-sectional view along line A-A' of (a), and (c) is a cross-sectional view along line B-B' of (a).

The LED package substrate 31 is a substrate on which a plurality of chips (light-emitting element (LED) chips) are housed in a single package to form a light-emitting device, and is made from a lead frame substrate that is not depicted. As depicted in FIG. 1, the lead frame substrate is provided with a plurality of lead frames 22 made of a metal material arranged in a matrix form. The lead frames 22 constitute electrodes for mounting LED chips 16. The plurality of lead frames 22 are connected in a grid form by extending portions 22a that are made of the same material as the lead frames 22 and extend from the lead frames 22.

The lead frames 22 are provided with a first lead electrode portion 23 and a second lead electrode portion 24 that are separated from each other. The first lead electrode portion 23 and the second lead electrode portion 24 constitute a pair of electrodes, and, for example, the first lead electrode portion 23 is connected to an anode of an LED chip 16 and the second lead electrode portion 24 has the LED chip 16 mounted thereon and is connected to a cathode of the LED chip 16. Adjacent first lead electrode portions 23 are connected by the extending portions 22a, and adjacent second lead electrode portions 24 are connected by the extending portions 22a.

In a package resin forming step, as depicted in FIG. 1, package resin 14 made of white resin is formed on the lead frame substrate by insert forming or the like. The package resin 14 is formed such that recesses, in which front surfaces of the first lead electrode portions 23 and the second lead electrode portions 24 are exposed, are provided.

Next, in an LED chip mounting step, the LED chips 16 are die-bonded with silicon resin to the front surfaces of exposed portions in the second lead electrode portions 24, in the recesses in the package resin 14.

In addition, in the die-bonded LED chips 16, upper electrodes of the LED chips 16 and the first lead electrode portions 23 are connected by wires 15 made of gold (Au). Furthermore, the upper electrodes of the LED chips 16 and the second lead electrode portions 24 are connected by the wires 15. The LED chips 16 are mounted on the lead frames 22 in this way.

Next, in a sealing resin forming step, sealing resin 17 is filled into the recesses in the package resin 14 in which the LED chips 16 are mounted. Here, a phosphor 18 or a phosphor 19 is mixed into this sealing resin 17. The sealing resin 17 is filled into the recesses in the package resin 14 such that the sealing resin 17 in which the same phosphor from among the phosphors 18 and 19 has been mixed is arranged side-by-side in the X direction and different phosphors are arranged side-by-side in an alternating manner in the Y direction. In the present embodiment, in the package resin 14 on which the LED chips 16 are mounted, X-direction regions into which the sealing resin 17 that includes the phosphor 18 (first sealing resin) is filled are configured as regions X1 and X-direction regions into which the sealing resin 17 that includes the phosphor 19 (type of phosphor that is different from the phosphor 18) (second sealing resin) is filled are configured as X2 in such a way that the regions X1 and X2 are arranged side-by-side in an alternating manner. It should be noted that the LED chips 16 can be formed without the second sealing resin including a phosphor. A configuration (4) of FIG. 12 described hereinafter is an example thereof. Furthermore, it is preferable that the resin materials for the first sealing resin and the second sealing resin be the same.

In FIG. 1, phosphors 28 that are formed by the sealing resin 17 in which the phosphor 18 is mixed being filled into the recesses in the package resin 14 are arranged side-by-side in the X direction in a column at the left edge of the page space. Phosphors 29 that are formed by the sealing resin 17 in which the phosphor 19 is mixed being arranged in the recesses in the package resin 14 are arranged side-by-side in the X direction in the column immediately adjacent to the right of the aforementioned column. Thereafter, the phosphors 28, 29, 28 . . . arranged in the recesses in the package resin 14 are arranged side-by-side in an alternating manner in the Y direction.

As an example, in the LED package substrate 31, the lead frames 22 having the LED chips 16 arranged thereon are arranged 4×6 in the X direction×Y direction. It should be noted that the number of these lead frames 22 is not restricted and may be greater or less than 4×6. LEDs 13A constituting single packages are obtained from this LED package substrate 31.

Next, a cutting step that is a step in which LEDs 13 are obtained from the LED package substrate 31 will be described. As depicted in FIG. 1, an LED 13A constituting a single package is obtained by cutting out a portion including a plurality of the lead frames 22 from the LED package substrate 31.

In the cutting step, the extending portions 22a and the package resin 14 covering the extending portions 22a are cut in a grid form by a blade (rotary cutting blade) that is not depicted, such that a lead frame 22 having the phosphor 28 arranged thereon and a lead frame 22 adjacent to the aforementioned lead frame 22 and having the phosphor 29 arranged thereon are included therewith.

In other words, the extending portions 22a and the package resin 14 covering the extending portions 22a are cut in a grid form by the blade such that a pair of the phosphors 28 and 29 arranged side-by-side in the lateral direction orthogonal to the longitudinal direction are included therewith. It is thereby possible to obtain a plurality of the LEDs 13A from the LED package substrate 31.

It should be noted that the LEDs 13A after cutting may be prevented from scattering by affixing a cutting-purpose tape to the rear surface of the LED package substrate 31 prior to cutting. In the case where this cutting-purpose tape is affixed to the rear surface of the LED package substrate 31, for example, the cutting-purpose tape may be removed in the final step.

The plurality of LEDs 13A obtained in this way are arranged on a substrate as a plurality of the LEDs 13 such that a plurality thereof are arranged side-by-side in the X direction, thereby making an illumination device.

In this way, the method for manufacturing the LEDs 13 has a step in which the LED chips 16 are arranged on the lead frames 22 connected in a matrix form, and a step in which LEDs 13 having two LED chips 16 housed therein in a single package are obtained by cutting out portions including two lead frames 22 from the lead frames 22 on which the LED chips 16 are arranged. According to the aforementioned configuration, LEDs 13 in which two LED chips 16 are housed in a single package can be obtained by cutting out the extending portions 22a, and therefore the LEDs 13 can be easily obtained.

In addition, the sealing resin forming step, in which the sealing resin 17 that forms the phosphors 28 and 29 is arranged on the lead frames 22 on which the LED chips 16 are arranged, is included between the step in which the LED chips 16 are arranged and the step in which the LEDs 13 are obtained. In this way, the colors of the output light of the phosphors 28 and 29 arranged on adjacent lead frames 22 are different, and, in the step in which the LEDs 13 are obtained, portions including two lead frames 22 are cut out in such a way that the phosphors 28 and 29 having different output light colors are included therein.

According to the aforementioned configuration, by cutting out two lead frames 22 in such a way that the phosphors 28 and 29 having different output light colors are included therein, it is possible to obtain an LED 13 that is made of a single package from which a plurality of colors can be output. Thus, a special mold or the like is not required in order to obtain an LED 13 that outputs light of a plurality of colors, and the manufacturing cost can be suppressed.

(Overview of LED)

Figure 2:
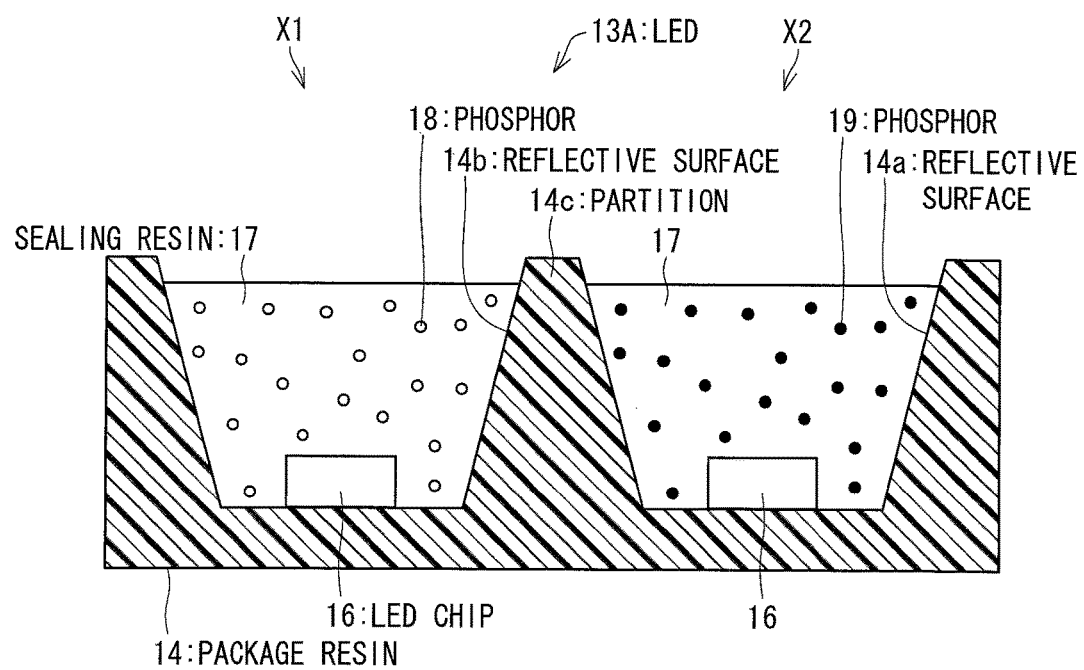
FIG. 2 is a cross section along line C-C' of FIG. 1(a).

FIG. 2 depicts a cross section along line C-C' of the LED package substrate 31 depicted in FIG. 1(a), in other words, a cross-sectional view of an LED 13A. As depicted in FIG. 2, the LED 13A constitutes a single LED package and includes the package resin 14, two LED chips 16, the sealing resin 17, the phosphors 18 and 19, and two lead frames 22.

The package resin 14 is formed in such a way that spaces (recesses) for the two LED chips 16 to be arranged therein and for forming two reflective surfaces 14a and 14b are provided in two locations. This package resin 14 is formed from, for example, a white resin material or the like, and is provided by means of insert forming such that the lead frames 22 are exposed at inner bottom surfaces. The two lead frames 22 are made of a metal material, and are connected by the extending portions (connection portions) 22a (FIG. 1(a)) made of the same material.

The package resin 14 has two recesses that correspond to the aforementioned regions X1 and X2, the LED chips 16 are arranged in these recesses, and the sealing resin 17 (first sealing resin and second sealing resin) that includes different types of the phosphors 18 and 19 is filled into the recesses, respectively.

The LED chips 16 (LED elements) are, for example, GaN semiconductor elements that have an insulating substrate, and the output light (first-order light) of the LED chips 16 is blue light of a range of 430 to 480 nm and has a peak wavelength in the vicinity of 450 nm. The LED chips 16 are arranged in the recesses in the package resin 14 by being die-bonded with silicon resin to the front surfaces of the exposed lead frames 22 (FIG. 1(b)).

In the LED chips 16, each of the positive and negative electrodes on the front surfaces of the LED chips 16 and the exposed portions in each of the lead frames 22 are wire-bonded by wires that are not depicted in FIG. 2. In this way, the LED chips 16 are electrically connected to the lead frames 22. Here, a description is given using a type of LED chip that has positive and negative electrodes on an upper surface; however, a type of LED that has two electrodes on an upper surface and lower surface may be used.

Furthermore, the package resin 14 has the reflective surfaces 14a and 14b that form the recesses. It is preferable that these reflective surfaces 14a and 14b be formed of a metal film including highly reflective Ag or Al or a white silicone such that the output light of the LED chips 16 is reflected to outside of the LED 13A.

In addition, the package resin 14 has a partition 14c between the recesses in the two locations. Due to this partition 14c, the output light from the two LED chips 16 is blocked between the two LED chips 16 in the LED 13A. In other words, the two LED chips 16 are optically separated by a partition 23c.

One of the recesses in the package resin 14 is sealed by being filled with the sealing resin 17 with the phosphor 18 being dispersed in the sealing resin 17. The phosphor 28 (FIG. 1(a)) is constituted by the LED chip 16, the sealing resin 17, and the phosphor 18 formed in the one recess in this package resin 14.

The other recess in the package resin 14 is sealed by being filled with the sealing resin 17 with the phosphor 19 being dispersed in the sealing resin 17. The phosphor 29 (FIG. 1(a)) is constituted by the LED chip 16, the sealing resin 17, and the phosphor 19 formed in the other recess in this package resin 14.

The sealing resin 17 is filled into the recesses to thereby seal the recesses in which the LED chips 16 are arranged. Furthermore, since the sealing resin 17 is required have high durability with respect to first-order light of a short wavelength, silicone resin is preferably used. The front surface of the sealing resin 17 forms a light emission surface from which light is output.

The phosphor 18 (red phosphor) is dispersed in the sealing resin 17. The phosphor 18 is a red phosphor that emits second-order light having a red color (peak wavelength of 600 nm or greater and 780 nm or less) of a longer wavelength than the first-order light, and is made of a phosphor material in which $CaAlSiN_3$:Eu is mixed or a phosphor material (KSF) in which $K_2SiF_6$:Mn is mixed, for example.

Similar to the phosphor 18, the phosphor 19 (green phosphor) is dispersed in the sealing resin 17. The phosphor 19 is a green phosphor that emits second-order light having a green color (peak wavelength of 500 nm or greater and 550 nm or less) of a longer wavelength than the first-order light, and is made of a phosphor material of Eu-activated β-sialon, for example.

In the LED 13A configured as described above, as first-order light (blue light) output from one of the LED chips 16 passes through the sealing resin 17, a portion thereof excites the phosphor 18 and is converted into second-order light (red light). Thus, blue first-order light and red second-order light mix, and magenta light is emitted to the outside as output light from the phosphor 28.

Furthermore, in the LED 13A, as first-order light (blue light) output from the other LED chip 16 passes through the sealing resin 17, a portion thereof excites the phosphor 19 and is converted into second-order light (green light). Thus, blue first-order light and green second-order light mix, and cyan light is output to the outside as output light from the phosphor 29. In this way, magenta light and cyan light are emitted to the outside from the LED 13A.

Consequently, the LED 13A configured as described above is mounted in a light source unit, and the light source unit thereby emits a white light as a result of the aforementioned magenta light and cyan light mixing. In this way, light of two different colors is output from the phosphors 28 and 29 that form a single package.

Furthermore, the color of the light output from each of the phosphors 28 and 29 may be another color as a result of changing the combination of the emission colors of the LED chips 16 and the phosphors mixed into the sealing resin 17.

For example, an LED chip and a phosphor may be combined such that light of an electric-bulb color of 3,000 K is output from the phosphor 28 and light of a daylight color of 6,500 K is output from the phosphor 29.

Furthermore, an LED chip that forms the phosphor 29 may be an LED chip that outputs green light with a phosphor not being mixed into the sealing resin 17, and a green light is thereby made to be output from the phosphor 29. A phosphor 29 that outputs green light and a phosphor 28 that outputs magenda light as described above may thereby be obtained.

In addition, the phosphors 18 and 19 may not be mixed into the sealing resin 17, and the light from the LED chips may be output as it is without wavelength conversion. In this case, an LED chip that emits white light rather than blue light is used for the LED chips. The phosphors 28 and 29 thereby output light of the same color.

(Resin Sealing Step)

Here, a step in which the sealing resin 17 in the LED 13A is sealed will be described.

FIGS. 3(a) and (b) are schematic diagrams depicting a step in which the sealing resin 17 is filled into cavities 12. Here, as depicted in FIG. 2, the sealing resin 17 represents resin in a state of having been filled into recesses (cavities 12) in the package resin 14 (in other words, a sealed state), and is distinguished from solid-state phosphor-containing sealing resin 40 used in a sealing step described hereinafter.

As depicted in FIG. 3(a), a multi-cavity circuit substrate 10 having the LEDs 13A mounted thereon is placed on a heater plate 51, and a first cut plate 52, a first porous plate 53, and a heater block 54 are stacked in this order in a substantially parallel manner onto this multi-cavity circuit substrate 10 (set-up step). Block-shaped phosphor-containing sealing resin 40 is then placed on the first porous plate 53 and inside an opening 54a in the heater block 54 (placement step).

Figure 3:
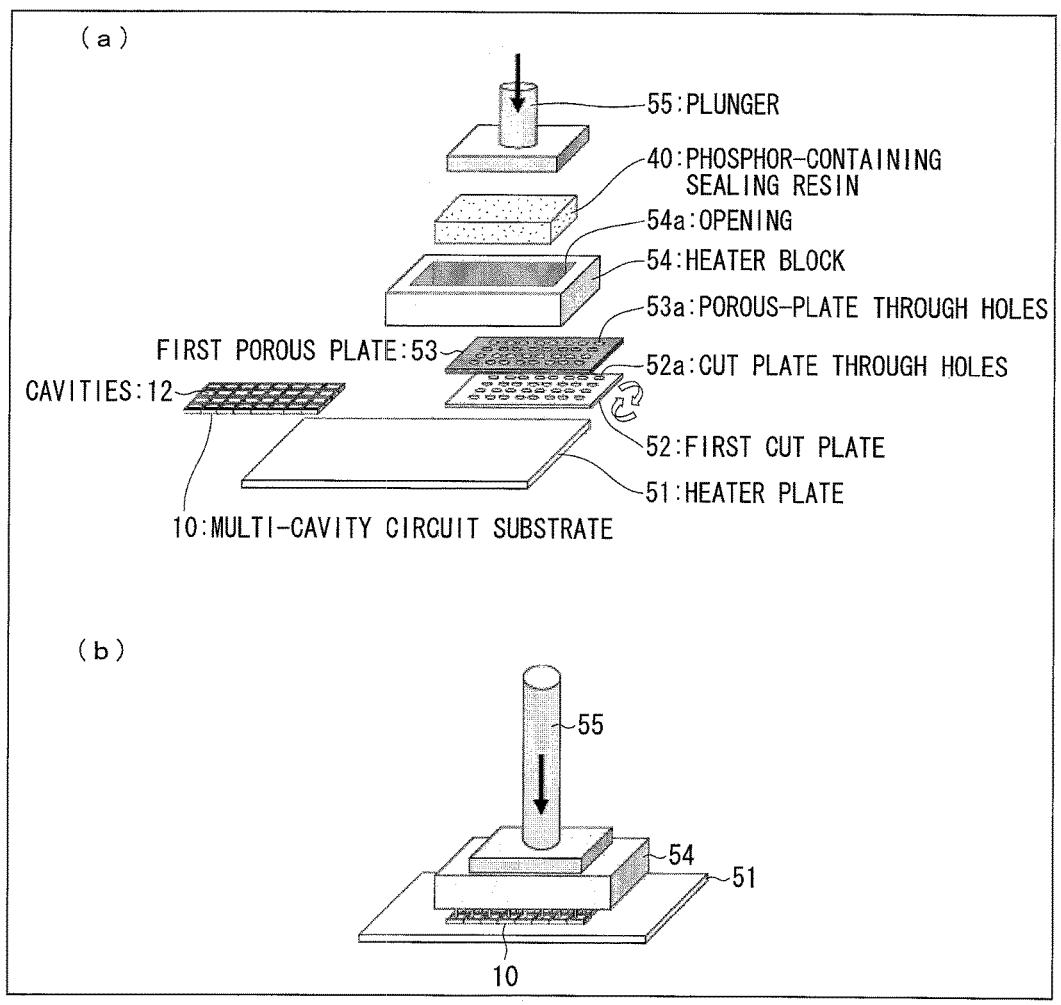
FIGS. 3(a) and (b) are schematic diagrams depicting a step in which phosphor-containing sealing resin is filled into cavities.
Figure 4:
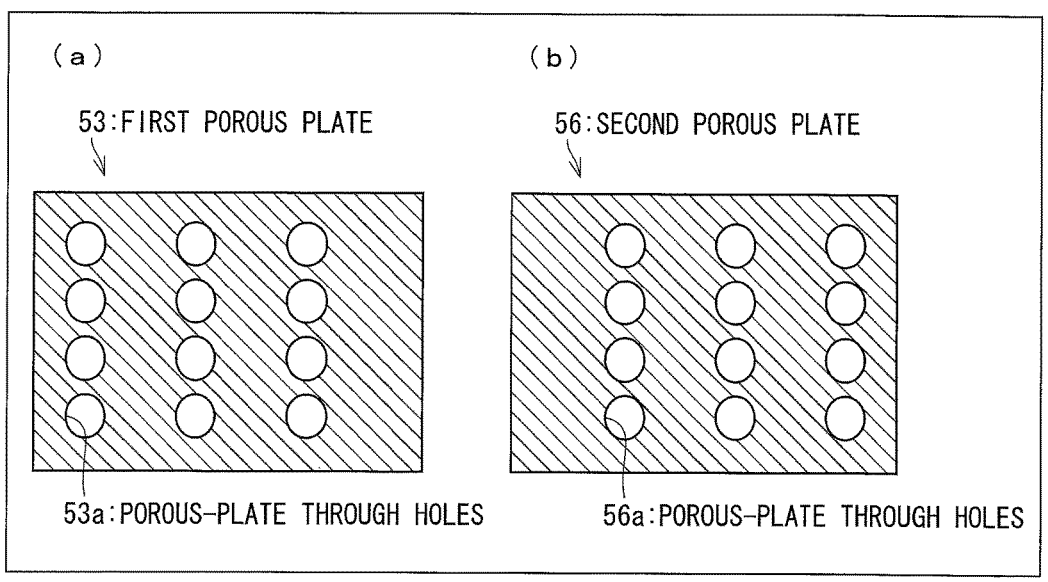
FIGS. 4(a) and (b) are plan views of porous plates used in the step of FIG. 3(a).

In the present embodiment, two types of porous plates are used as depicted in FIGS. 4(a) and (b). FIG. 4(a) depicts a plan view of the first porous plate 53, and FIG. 4(b) depicts a plan view of a second porous plate 56. An example in which the first porous plate 53 is used is depicted in FIG. 3 for convenience of the description.

Porous-plate through holes 53a are formed in the first porous plate 53 such that, in a state in which the first porous plate 53 is set as depicted in FIG. 3(a), the porous-plate through holes 53a correspond to the cavities 12 that include the LEDs 13A arranged in the regions X1 depicted in FIG. 1(a). In other words, in the first porous plate 53, the porous-plate through holes 53a corresponding to the cavities 12 in the multi-cavity circuit substrate 10 are formed in odd-number column units. An odd-number column may only be one column.

Likewise, porous-plate through holes 56a are formed in the second porous plate 56 such that, in a state in which the second porous plate 56 is set as depicted in FIG. 3(a), the porous-plate through holes 56a correspond to the cavities 12 that include the LEDs 13A arranged in the regions X2 depicted in FIG. 1(a). In other words, in the second porous plate 56, the porous-plate through holes 53a corresponding to the cavities 12 in the multi-cavity circuit substrate 10 are formed in even-number column units. An even-number column may only be one column.

The phosphor-containing sealing resin 40 has a phosphor uniformly dispersed in silicone resin. It should be noted that the type of phosphor is differed in the case where the first porous plate 53 is used and arranged on the cavities 12 and in the case where the second porous plate 56 is used and arranged on the cavities 12. For example, as depicted in FIG. 2, the phosphor 18 is used in the case where the first porous plate 53 is used to fill the cavities 12 in the regions X1, and the phosphor 19 is used in the case where the second porous plate 56 is used to fill the cavities 12 in the regions X2.

Figure 5:
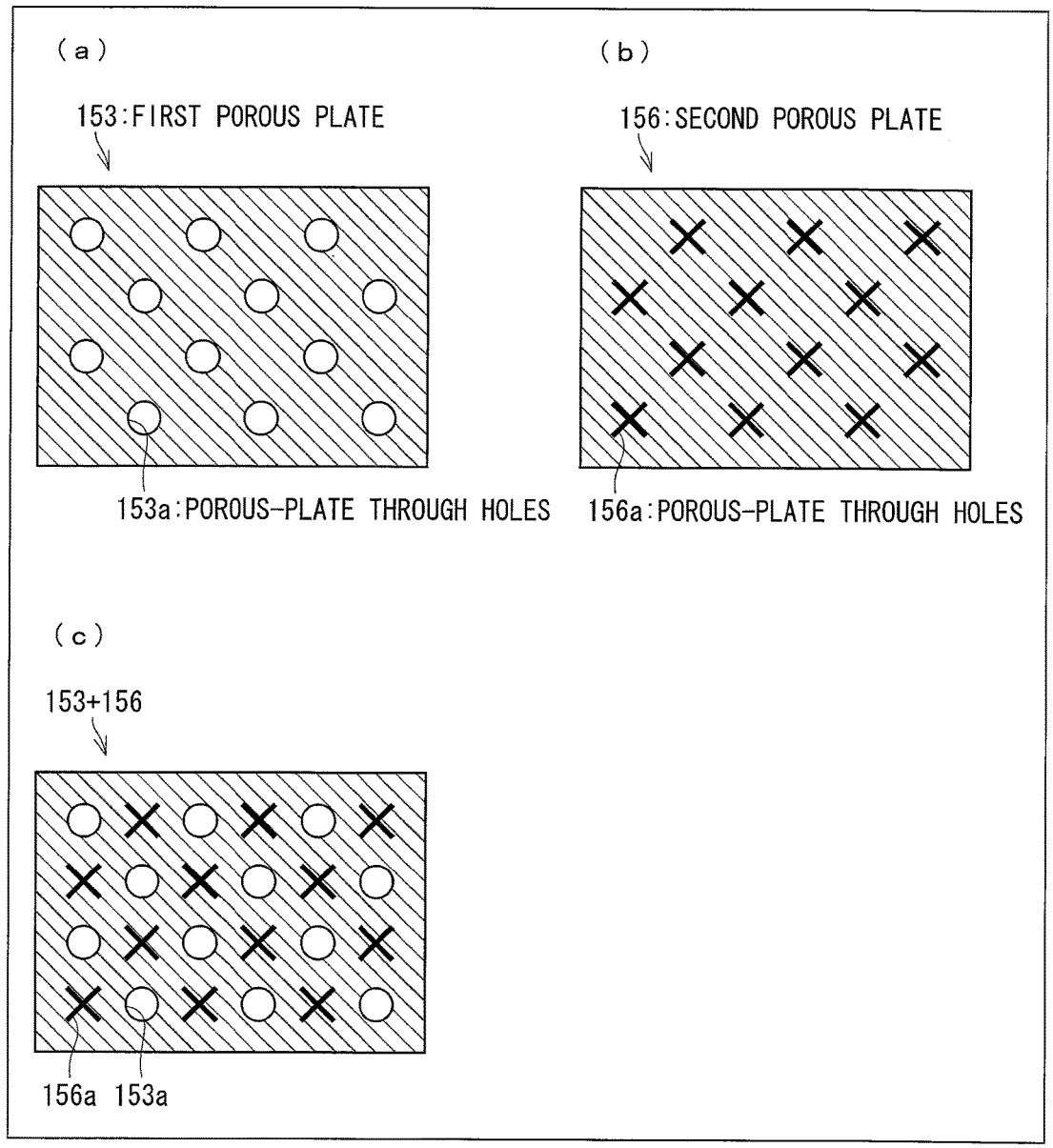
FIG. 5 is a plan view of other examples of porous plates.

It should be noted that, in the present embodiment, a description has been given using the first porous plate 53 (FIG. 4(a)) in which the porous-plate through holes 53a are formed in odd-number column units and the second porous plate 56 (FIG. 4(b)) in which the porous-plate through holes 53a are formed in even-number column units. However, the present invention is not restricted thereto and, for example, a first porous plate 153 such as that depicted in FIG. 5(a) in which a plurality of porous-plate through holes 153a (round marks in the drawing) are formed as a first group and a second porous plate 156 such as that depicted in FIG. 5(b) in which a plurality of porous-plate through holes 156a (cross marks in the drawing) that are different from the first group are formed as a second group may be used as the porous plates. The porous-plate through holes 153a and the porous-plate through holes 156a are formed in such a way as to be arranged in a vertically and horizontally alternating manner as depicted in FIG. 5(c) when the first porous plate 153 and the second porous plate 156 are stacked. It should be noted that cross marks have been used in the drawing in order to aid understanding; however, as described hereinafter, the shapes of the porous-plate through holes are not particularly restricted, and it is preferable that the dimension of the porous-plate through holes be smaller than the dimension of the openings of the cavities 12.

(Silicone Resin)

The aforementioned silicone resin is subjected to primary cross-linking by the addition of a prescribed temperature that is less than a secondary cross-linking temperature described hereinafter and time, and maintains a non-liquid state having a viscosity (100 Pa·S or greater and 1E+5 Pa·S or less) at which precipitation does not completely occur even when particles having a greater specific gravity than the silicone resin (for example, a phosphor or the like) are included and processing is possible. It should be noted that primary cross-linking refers to a non-liquid state at room temperature at which there are cross-linking points and curing is able to further progress due to a prescribed curing condition (the addition of the prescribed temperature and time).

Figure 7:
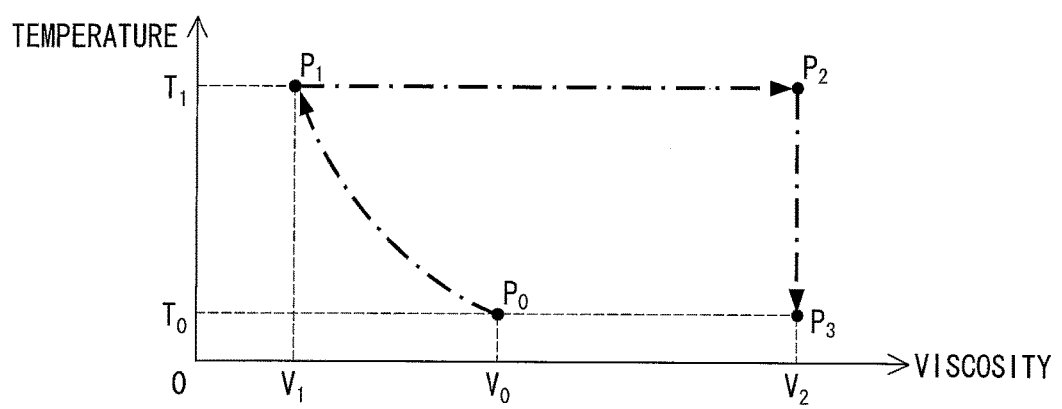
FIG. 7 is a graph conceptually depicting viscosity characteristics of silicone resin included in phosphor-containing sealing resin.

As depicted in FIG. 7, the viscosity of this silicone resin at room temperature $T_0$ (approximately 25° C.) is a viscosity $V_0$ (see $P_0$ in the drawing). The viscosity $V_0$ is a viscosity at which the shape of the phosphor-containing sealing resin 40 is able to be maintained at room temperature $T_0$.

In the case where this silicone resin is heated from room temperature $T_0$ to near a secondary cross-linking temperature $T_1$ (approximately 125° C.) that is a temperature at which this silicone resin forms secondary cross-links, the viscosity of the silicone resin decreases, and the viscosity at immediately prior to the secondary cross-linking temperature $T_1$ is a viscosity $V_1$ (see $P_1$ in the drawing). The viscosity $V_1$ is a viscosity at which the silicone resin melts such that it is able to flow.

The change in viscosity of the silicone resin in a temperature region from room temperature $T_0$ to less than the secondary cross-linking temperature $T_1$ is a thermo-reversible change. Therefore, in the case where the temperature is decreased from near the secondary cross-linking temperature $T_1$ to room temperature $T_0$, the viscosity of the silicone resin increases and returns to the original viscosity $V_0$ at room temperature $T_0$. Consequently, by changing the temperature in the temperature region from room temperature $T_0$ to less than the secondary cross-linking temperature $T_1$, the viscosity of the silicone resin can be repeatedly adjusted between the viscosity $V_0$ and the viscosity $V_1$.

On the other hand, in the case where the silicone resin is heated to the secondary cross-linking temperature $T_1$ or higher, secondary cross-links are formed in the silicone resin and curing occurs. It should be noted that, although the viscosity of the silicone resin after curing is not able to be substantially defined, in the case where the viscosity of the silicone resin after curing is conceptually defined as a viscosity $V_2$, the viscosity of the silicone resin rises from the viscosity $V_1$ to the viscosity $V_2$ (see $P_2$ in the drawing). In other words, the viscosity $V_2$ is conceptually defined as the viscosity at the secondary cross-linking temperature T1 when the silicone resin has formed secondary cross-links.

In the case where the temperature of the silicone resin after secondary cross-linking is increased or decreased from the secondary cross-linking temperature $T_1$, changes occur in physical properties such as the viscosity and elasticity at the secondary cross-linking temperature $T_1$ (polymeric properties). However, compared to the silicone resin before secondary cross-linking, the viscosity and elastic modulus increase in a relative manner (however, for convenience, it is depicted that the viscosity $V_2$ is maintained at $P_3$ in the drawing).

It should be noted that the secondary cross-linking is not restricted to the aforementioned and refers to curing further progressing due to a cross-linking reaction or the like caused by a reaction catalyst that is different from at the time of synthesis, and refers to a state in which a reversible viscosity change does not occur due to the temperature as described above.

Various phosphors are kneaded and mixed in the phosphor-containing sealing resin 40 in accordance with the required optical characteristics, and the concentration of the phosphors (content percentage) is adjusted. However, if this silicone resin is used, the viscosity thereof can be repeatedly adjusted as long as it is in the state prior to secondary cross-linking, and therefore, as described hereinafter, it is possible to form phosphor-containing sealing resin 40 in which the phosphor dispersion state is uniform.

The heater block 54 is provided with a function to adjust a temperature including a temperature range from room temperature to less than the secondary cross-linking temperature at which the phosphor-containing sealing resin 40 can be heated and melted. The heater block 54 is a frame-like member that has an opening 54a penetrating therethrough, and the phosphor-containing sealing resin 40 is arranged inside this opening 54a.

The first porous plate 53 has a plurality of the porous-plate through holes (through holes) 53a formed therein. As described above, the porous-plate through holes 53a are formed in positions that correspond to the cavities 12, and, as described hereinafter, the phosphor-containing sealing resin 40 is extruded toward the cavities 12 from the porous-plate through holes 53a due to pressure produced by a plunger 55.

The first cut plate 52 cuts the phosphor-containing sealing resin 40 extruded from the porous-plate through holes 53a to a prescribed length. Cut plate through holes 52a that correspond to the porous-plate through holes 53a are formed in the first cut plate 52, and by causing the first cut plate 52 to move eccentrically in the direction of the arrows in the drawing, the phosphor-containing sealing resin 40 is cut to the prescribed length by blades (not depicted) provided in the cut plate through holes 52a.

The heater plate 51 heats the multi-cavity circuit substrate 10 placed thereon. The heater plate 51 heats the multi-cavity circuit substrate 10 at a temperature region of equal to or less than the secondary cross-linking temperature, for example.

Figure 8:
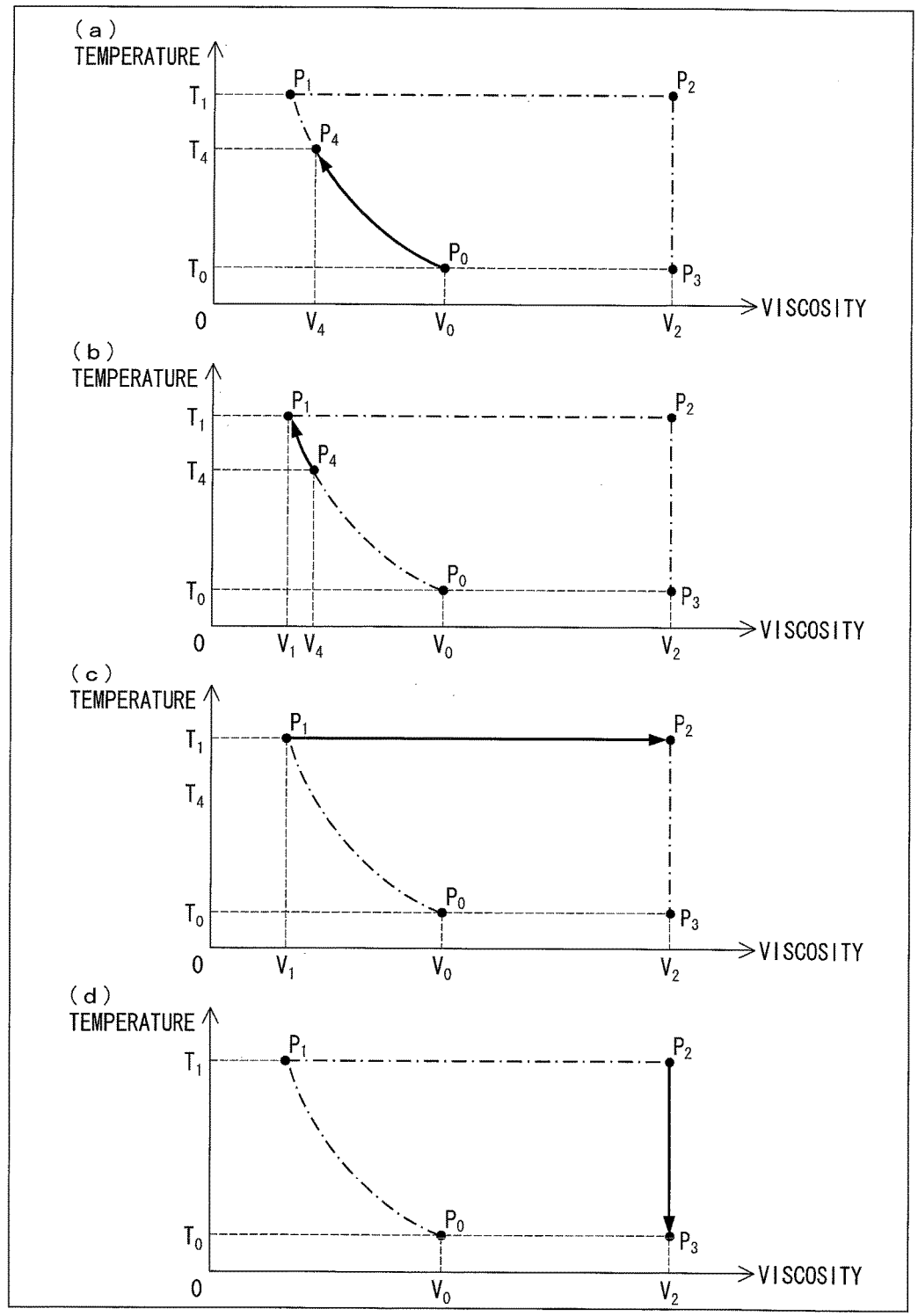
FIGS. 8(a) to (d) are graphs conceptually depicting viscosity changes of silicone resin in a series of steps from filling phosphor-containing sealing resin into cavities to curing.

Once such members have been set up as described above, the phosphor-containing sealing resin 40 placed on the first porous plate 33 is heated and melted by the heater block 54, and the viscosity of the phosphor-containing sealing resin 40 is decreased. At this time, as depicted in FIG. 8(a), by heating the phosphor-containing sealing resin 40 from room temperature $T_0$ to a temperature $T_4$ (for example, 80° C. or higher and lower than 120° C.) that is near the secondary cross-linking temperature $T_1$, the viscosity of the silicone resin is decreased to the flow-enabling viscosity $V_4$ while suppressing precipitation of the phosphor (see $P_4$ in the drawing).

Figure 6:
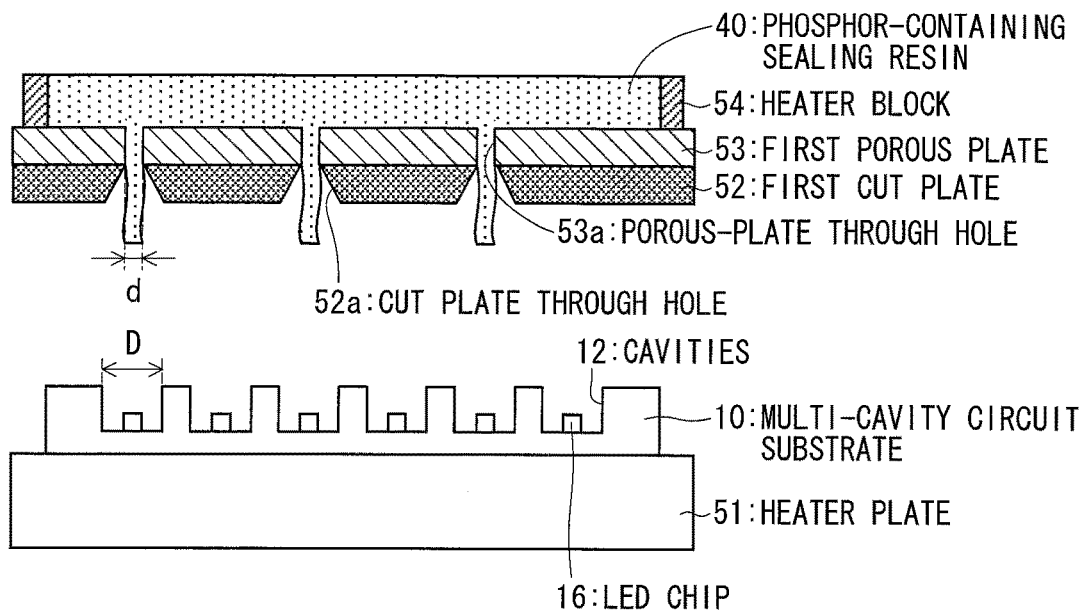
FIG. 6 is a cross-sectional view depicting an extrusion step performed after the step of FIG. 3(b).

Next, as depicted in FIG. 3(b), the plunger 55 is used to press the phosphor-containing sealing resin 40 placed on the first porous plate 53, toward the multi-cavity circuit substrate 10. As depicted in FIG. 6, the phosphor-containing sealing resin 40 is thereby extruded in a thread-like form from the porous-plate through holes 53a in the first porous plate 53, toward the cavities 12 (extrusion step).

As depicted in FIG. 6, due to the pressure of the plunger 55, the phosphor-containing sealing resin 40 is extruded in a thread-like form from the porous-plate through holes 53a in the first porous plate 53. Then, when the thread-like phosphor-containing sealing resin 40 has reached a prescribed length, the phosphor-containing sealing resin 40 that has been extruded in a thread-like form from the porous-plate through holes 53a is cut by causing the first cut plate 32 to rotate eccentrically. It is thereby possible for each cavity 12 to be simultaneously filled with portions of the phosphor-containing sealing resin 40 that contain equal amounts of phosphor and have been cut to the prescribed length (filling step).

It should be noted that by making a dimension d of the porous-plate through holes 53a smaller than a dimension D of the openings of the cavities 12, it becomes easy for the cavities 12 to be filled with the phosphor-containing sealing resin 40. Furthermore, by adjusting the length of the phosphor-containing sealing resin 40 extruded in a thread-like form, it becomes easy for filling to be performed with a suitable amount of the phosphor-containing sealing resin 40 that corresponds to the volume of the cavities 12.

According to the above step, the first porous plate 53 is used for the phosphor-containing sealing resin 40 to be arranged in the cavities 12 of the regions X1 in the multi-cavity circuit substrate 10 (first arrangement step).

Next, by using the second porous plate 56 instead of the first porous plate 53 to execute the same sealing step described above, the phosphor-containing sealing resin 40 is arranged in the cavities 12 of the regions X2 in the multi-cavity circuit substrate 10 (second arrangement step).

The heater plate 51 heats the multi-cavity circuit substrate 10 and causes the phosphor-containing sealing resin 40 to soften such that the phosphor-containing sealing resin 40 arranged inside the cavities 12 comes into close contact with the inner surfaces of the cavities 12 (melting step). It is sufficient as long as the temperature of the multi-cavity circuit substrate 10 in this filling step is a temperature at which the phosphor-containing sealing resin 40 is softened to the extent at which the phosphor-containing sealing resin 40 easily comes into close contact with the inside of the cavities 12 without it being necessary to reach the secondary cross-linking temperature.

Once each cavity 12 has been filled with the phosphor-containing sealing resin 40, as depicted in FIG. 8(b), heating is performed at the secondary cross-linking temperature $T_1$ (for example, 125° C.) by the heater plate 51 (see $P_1$ in the drawing). As depicted in FIG. 8(c), the silicone resin thereby forms secondary cross-links and curing starts (curing step; see $P_2$ in the drawing). At this time, the phosphor-containing sealing resin 40 that has been filled into the cavities 12 starts to cure from the bottom side of the cavities 12 due to be heater plate 51. Therefore, stress due to the curing contraction of the phosphor-containing sealing resin 40 is able to be distributed to the upper portion of the phosphor-containing sealing resin 40, in other words, the opening side of the cavities 12, and therefore the occurrence of cracks and so forth can be suppressed to improve the reliability of the phosphors 28 and 29.

The silicone resin is then completely cured by heating the multi-cavity circuit substrate 10 to the secondary cross-linking temperature $T_1$ or higher (for example, 125° C. or higher and 170° C. or lower) with an oven or the like (curing step). Thereafter, the multi-cavity circuit substrate 10 is removed from the oven or the like and the temperature is decreased to room temperature $T_0$. At this time, as depicted in FIG. 8(d), even in the case where the temperature has decreased to room temperature T0, the viscosity of the silicone resin in which secondary cross-links have formed becomes V2 (see P3 in the drawing). It should be noted that, as a result of the phosphor-containing sealing resin 40 being heated by the heater block 54 in the aforementioned extrusion step, the viscosity of the silicone resin is decreased to the flow-enabling viscosity V4 while precipitation of the phosphor is suppressed. However, by increasing the extrusion pressure, it becomes possible for the phosphor-containing sealing resin 40 to be extruded at room temperature T0 without increasing the temperature of the heater block 54, and the heater block 54 may remain at room temperature T0.

As described above, an LED 13A having a state in which the LED chips 16 are sealed by the sealing resin 17 is formed as depicted in FIG. 2.

As described above, two types of porous plates (the first porous plate 53 and the second porous plate 56) have been used in the present embodiment as a means for arranging the phosphor-containing sealing resin 40 that includes the different types of phosphors 18 and 19 in two recesses formed in one package resin 14. However, the means for arranging the phosphor-containing sealing resin 40 is not restricted thereto, and the phosphor-containing sealing resin 40 may be arranged in a string-like form wound onto a reel as described in the following embodiment 2.

Embodiment 2

If another embodiment of the present invention were to be described, it would be as follows. It should be noted that, for convenience of the description, members having the same function as the members described in the aforementioned embodiment 1 are denoted by the same reference signs and descriptions thereof are omitted.

Figure 9:
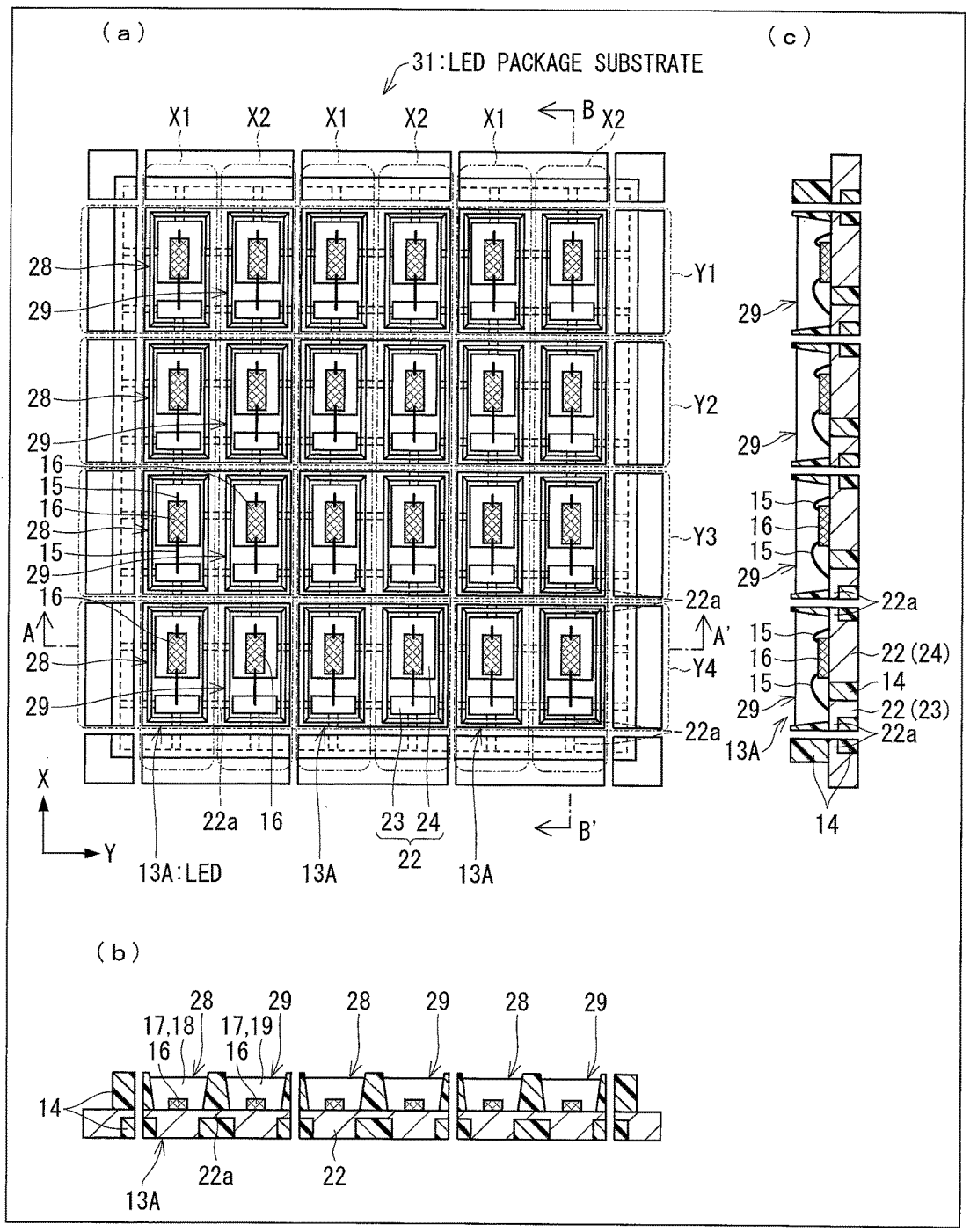
FIG. 9 depicts an LED package substrate according to embodiment 2 of the present invention, (a) is a plan view depicting a configuration of the LED package substrate, (b) is a cross-sectional view along line A-A' of (a), and (c) is a cross-sectional view along line B-B' of (a).

FIG. 9(a) is a plan view of the LED package substrate 31, (b) is a cross-sectional view along line A-A' of (a), and (c) is a cross-sectional view along line B-B' of (a).

In the present embodiment, different from the aforementioned embodiment 1, the phosphor-containing sealing resin 40 including the different phosphors 18 and 19 is arranged in the recesses in the package resin 14 in one go. Namely, as depicted in FIG. 9(a), the phosphor-containing sealing resin 40 is arranged with the region X1, the region X2, the region X1, the region X2, the region X1, and the region X2 that are arranged side-by-side in one column in the Y direction being considered as one region Yn. It should be noted that, in the present embodiment, the phosphor-containing sealing resin 40 is arranged in order in a region Y1, a region Y2, a region Y3, and a region Y4 arranged side-by-side in the X direction. In order to realize this kind of arrangement of the phosphor-containing sealing resin 40, a sealing resin arrangement device that uses open reels having string-like phosphor-containing sealing resin 40 wound onto reels is used.

(Sealing Resin Arrangement Device)

Figure 10:
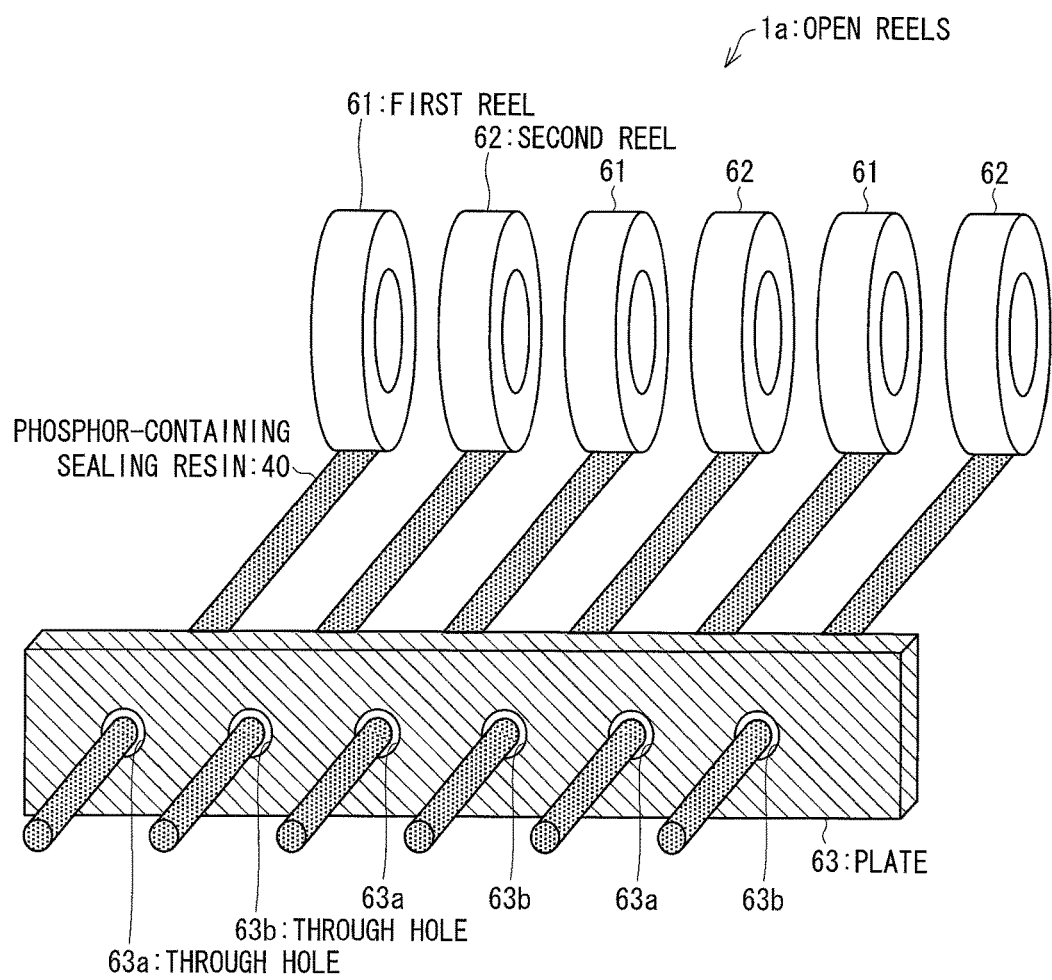
FIG. 10 is a schematic configuration diagram of a device for filling phosphor-containing sealing resin into cavities.

FIG. 10 is a schematic configuration perspective view of the sealing resin arrangement device.

The sealing resin arrangement device includes open reels 1a that are supply sources of the phosphor-containing sealing resin 40, and a rectangular plate 63 that cuts, to a prescribed length, the string-like phosphor-containing sealing resin 40 pulled out from the open reels 1a.

Figure 11:
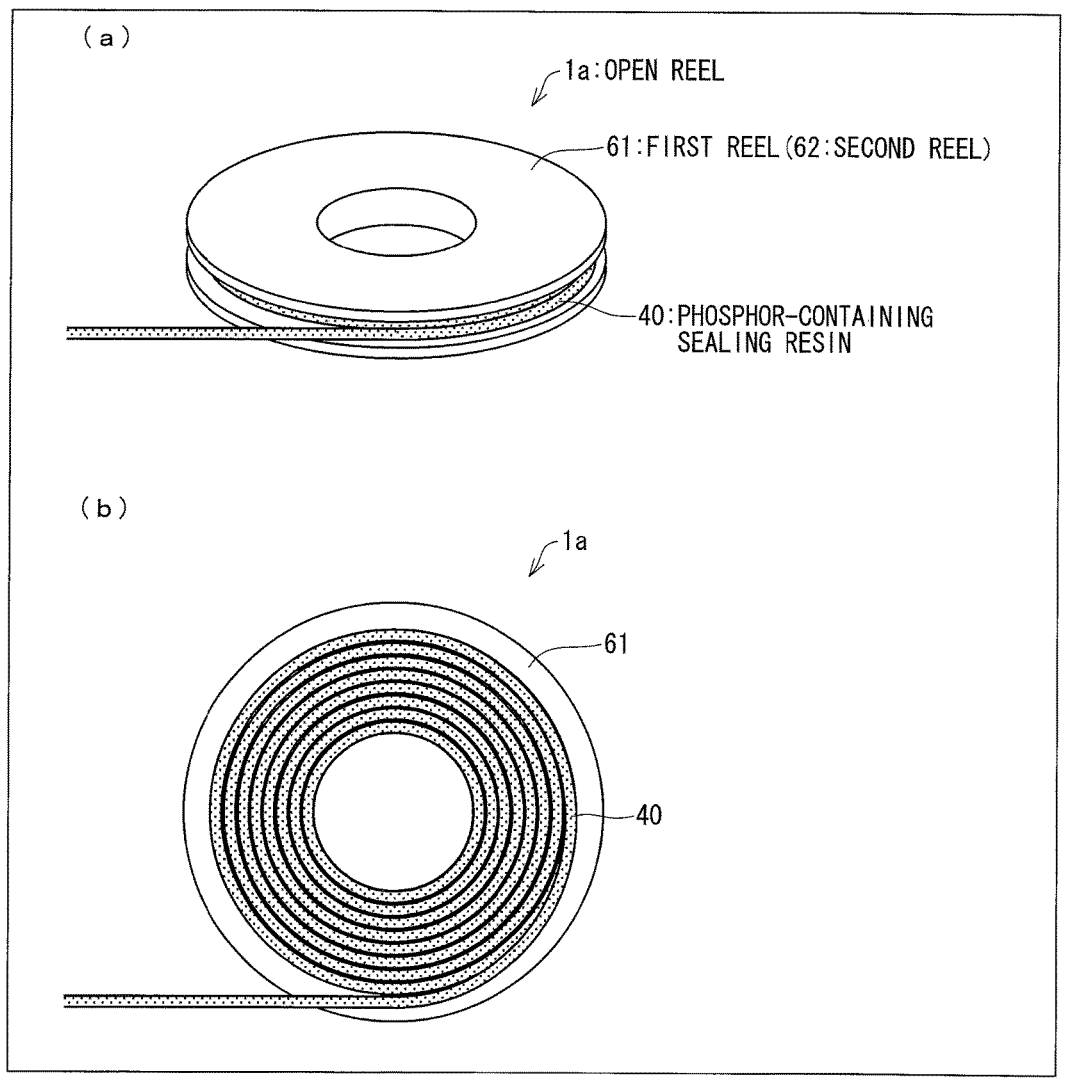
FIG. 11(a) is a perspective view depicting an open reel that is depicted in FIG. 10, and (b) is a top transparent view thereof.

FIG. 11 is perspective view depicting the external configuration of an open reel 1a according to the present embodiment. As depicted in FIGS. 11(a) and (b), the open reel 1a is provided with the phosphor-containing sealing resin 40 and a first reel 61 (second reel 62). Here, it should be noted that the phosphor-containing sealing resin 40 having different types of phosphor contained therein is wound onto the first reels 61 and the second reels 62. In the present embodiment, the phosphor 18 is contained in the phosphor-containing sealing resin 40 that is wound onto the first reels 61, and the phosphor 19 is contained in the phosphor-containing sealing resin 40 that is wound onto the second reels 62.

Consequently, in the sealing resin arrangement device, as depicted in FIG. 10, the first reels 61 and the second reels 62, onto which two types of the string-like phosphor-containing sealing resin 40 having different types of phosphor contained therein are wound, are arranged in an alternating manner in the open reels 1a.

The string-like phosphor-containing sealing resin 40 fed out from each of the first reels 61 and the second reels 62 passes through a plurality of through holes 63a and 63b that are formed side-by-side in an alternating manner in the longitudinal direction of the plate 63, and is cut to a desired length.

The phosphor-containing sealing resin 40 fed out from the first reels 61 passes through the through holes 63a, and the phosphor-containing sealing resin 40 fed out from the second reels 62 passes through the through holes 63b. Consequently, the through holes 63a and the through holes 63b are formed in the plate 63 in such a way as to correspond to the regions X1 and the regions X2 depicted in FIG. 9(a), respectively.

A cut plate, which is not depicted, is disposed at the open reels 1a side of the plate 63, and this cut plate is rotated eccentrically to thereby cut the phosphor-containing sealing resin 40 that has passed through the through holes 63a and 63b.

Thus, in the sealing resin arrangement device depicted in FIG. 10, it is possible to arrange first sealing resin (the phosphor-containing sealing resin 40 containing the phosphor 18) and second sealing resin (the phosphor-containing sealing resin 40 containing the phosphor 19) inside the cavities 12 in row units (in order of regions Y1, Y2, Y3, and Y4) by means of the first reels 61 onto which the first sealing resin is wound and the second reels 62 onto which the second sealing resin is wound. Namely, the first arrangement step (arrangement step for the phosphor-containing sealing resin 40 that includes the phosphor 18) and the second arrangement step (arrangement step for the phosphor-containing sealing resin 40 that includes the phosphor 19) are performed in row units at the same time.

(Resin Sealing Step)

The resin sealing step will be described hereinafter.

First, in the sealing resin arrangement device, the phosphor-containing sealing resin 40 is fed out from each of the first reels 61 and the second reels 62 arranged in an alternating manner, is cut to the desired length when passing through the through holes 63a and 63b in the plate 63, and is arranged in each of the X-direction cavities in the region Y1 depicted in FIG. 9(a).

The same operation is performed up to the regions Y2, Y3, and Y4 and the final region depicted in FIG. 9(a).

Next, the phosphor-containing sealing resin 40 arranged in each of the cavities in the LED package substrate 31 is heated and melted.

Finally, after being heated and melted, the phosphor-containing sealing resin 40 is completely cured to obtain LEDs 13A in which the first sealing resin has been sealed in the cavities of the regions X1 and the second sealing resin has been sealed in the cavities of the regions X2.

The processing after the heating and melting of the phosphor-containing sealing resin 40 arranged in each of the cavities in the LED package substrate 31 is the same as that performed in the aforementioned embodiment 1 and therefore the details thereof are omitted.

An example in which the first reels 61 and the second reels 62 are arranged in an alternating manner has been given in the present embodiment; however, it should be noted that the first reels 61 and the second reels 62 may be arranged so as to oppose each other.

[Supplemental Matter]

FIG. 12 is a table depicting combinations of phosphors and LEDs.

The aforementioned embodiments 1 and 2 are both suitable for a package structure in which two LEDs 1 and 2 that constitute one package are combined, a so-called 2-in-1 package construction, and configurations (1) to (4) depicted in FIG. 12 in which phosphors and LEDs are combined can be applied as the LEDs 13A.

According to the aforementioned embodiment 1, the arrangement of the through holes in the first porous plate and the through holes in the second porous plate is decided depending on the arrangement of the LED 1 and the LED 2. In other words, the through holes in the first porous plate and the LED 1 are arranged corresponding to each other on a one-to-one basis, and the through holes of the second porous plate and the LED 2 are arranged corresponding to each other on a one-to-one basis.

For example, in configuration (1), sealing resin containing a red phosphor is applied in a blue chip (LED 1), and sealing resin containing a green phosphor is applied in a blue chip (LED 2).

In configuration (2), sealing resin containing a red phosphor is applied in a blue (peak wavelength: 455 nm) chip (LED 1), and sealing resin containing a green phosphor is applied in a blue (peak wavelength: 440 nm) chip (LED 2).

In configuration (3), sealing resin containing a green phosphor and a red phosphor is applied in a blue chip (LED 1), and sealing resin containing a yellow phosphor is applied in a blue chip (LED 2).

In configuration (4), sealing resin containing no phosphor is applied in a green chip (LED 1), and sealing resin containing a red phosphor is applied in a blue chip (LED 2).

Furthermore, in the aforementioned embodiments 1 and 2, a composite fluoride phosphor activated with Mn4+ is selected as the red phosphor. The following substances, for example, can be used as this composite fluoride phosphor.

$$A_2[MF_5]:Mn4+ \quad (1)$$

(Wherein, A is selected from Li, Na, K, Rb, Cs, NH4, and a combination thereof, and M is selected from Al, Ga, In, and a combination thereof.)

$$A_3[MF_6]:Mn4+ \quad (2)$$

(Wherein, A is selected from Li, Na, K, Rb, Cs, NH4, and a combination thereof, and M is selected from Al, Ga, In, and a combination thereof.)

$$Zn_2[MF_7]:Mn4+ \quad (3)$$

(Wherein, M is selected from Al, Ga, In, and a combination thereof.)

$$A[In_2F_7]:Mn4+ \quad (4)$$

(Wherein, A is selected from Li, Na, K, Rb, Cs, NH4, and a combination thereof.)

$$A_2[MF_6]:Mn4+ \quad (5)$$

(Wherein, A is selected from Li, Na, K, Rb, Cs, NH4, and a combination thereof, and M is selected from Ge, Si, Sn, Ti, Zr, and a combination thereof.)

$$E[MF_6]:Mn4+ \quad (6)$$

(Wherein, E is selected from Mg, Ca, Sr, Ba, Zn, and a combination thereof, and M is selected from Ge, Si, Sn, Ti, Zr, and a combination thereof.)

$$Ba0.65Zr0.35F2.70:Mn4+ \quad (7)$$

$$A_3[ZrF_7]:Mn4+ \quad (8)$$

(Wherein, A is selected from Li, Na, K, Rb, Cs, NH4, and a combination thereof.)

SUMMARY

A method for manufacturing a light-emitting device according to aspect 1 of the present invention is a method for manufacturing a light-emitting device in which a plurality of chips (LED chips 16) are housed in a single package (package resin 14), characterized by including: a first arrangement step in which, in a cavity circuit substrate (multi-cavity circuit substrate) on which light-emitting elements are mounted in a plurality of cavities 12 that open upward, solid-state first sealing resin (phosphor-containing sealing resin 40) containing a phosphor 18 is arranged in one of at least two of the cavities that form one package; a second arrangement step in which solid-state second sealing resin (phosphor-containing sealing resin 40) that is different from the first sealing resin is arranged in the other one of the at least two cavities; a melting step in which the first sealing resin arranged in the first arrangement step and the second sealing resin arranged in the second arrangement step are heated and thereby melted; and a curing step in which the first sealing resin and the second sealing resin melted in the melting step are cured.

According to the aforementioned configuration, as a result of the solid-state first sealing resin arranged in one of at the least two cavities that form one package and the solid-state second sealing resin arranged in the other of the at least two cavities being heated, thereby melted, and thereafter cured, the light-emitting elements inside the at least two cavities that form one package are sealed in one go by the sealing resin corresponding to each thereof.

Thus, an effect is demonstrated in that the manufacturing time can be shortened and the manufacturing cost can be reduced compared to the case where resin sealing is performed for each package.

A method for manufacturing a light-emitting device according to aspect 2 of the present invention is characterized in that, in the aforementioned aspect 1, in the first arrangement step, the first sealing resin is arranged in the cavities via through holes formed in a first porous plate, and, in the second arrangement step, the second sealing resin is arranged in the cavities via through holes formed in a second porous plate.

According to the aforementioned configuration, in each arrangement step, the sealing resin is arranged in the cavities via the through holes formed in each porous plate, and therefore, if each of the porous plates is set such that the through holes are positioned above the chips where sealing resin is to be arranged, the desired sealing resin is able to be reliably arranged in each cavity.

It is thereby possible to suppress a reduction in the yield of light-emitting devices caused by the desired resin not being arranged in a cavity.

A method for manufacturing a light-emitting device according to aspect 3 of the present invention is characterized in that, in the aforementioned aspect 2, in the first porous plate, the through holes corresponding to the cavities in the cavity circuit substrate are formed in a first group, and, in the second porous plate, the through holes corresponding to the cavities in the cavity circuit substrate are formed in a second group that is different from the first group.

A method for manufacturing a light-emitting device according to aspect 4 of the present invention is characterized by, in the aforementioned aspect 1, including: a first set-up step in which a first porous plate, in which through holes corresponding to a plurality of cavities that open upward are formed in odd-number column units, is set up in a substantially parallel manner above a substrate on which the light-emitting elements are mounted in the cavities; a first placement step in which the first sealing resin is placed on the first porous plate; a first extrusion step in which the first sealing resin is extruded in a thread-like form from the through holes toward the substrate while being heated and melted; a first filling step in which the first sealing resin extruded in a thread-like form is cut to a prescribed length and filled into the cavities; a second set-up step in which a second porous plate, in which through holes corresponding to the plurality of cavities that open upward are formed in even-number column units, is set up in a substantially parallel manner above the substrate on which the light-emitting elements are mounted in the cavities; a second placement step in which the second sealing resin is placed on the second porous plate; a second extrusion step in which the second sealing resin is extruded in a thread-like form from the through holes toward the substrate while being heated and melted; a second filling step in which the second sealing resin extruded in a thread-like form is cut to a prescribed length and filled into the cavities; and a curing step in which the first ceiling resin filled into the cavities due to the first filling step and the second ceiling resin filled into the cavities due to the second filling step are heated and cured.

A method for manufacturing a light-emitting device according to aspect 5 of the present invention is characterized in that, in the aforementioned aspect 1, in the first arrangement step and the second arrangement step, the first sealing resin and the second sealing resin are arranged in the cavities in the cavity circuit substrate such that the first sealing resin and the second sealing resin oppose each other in row units.

A method for manufacturing a light-emitting device according to aspect 6 of the present invention is characterized in that, in the aforementioned aspect 5, in the first arrangement step and the second arrangement step, the first sealing resin and the second sealing resin are fed out from a first reel 61 onto which the first sealing resin is wound and a second reel 62 onto which the second sealing resin is wound and are cut to a prescribed length, and the first sealing resin and the second sealing resin are arranged in the cavities in the cavity circuit substrate such that the first sealing resin and the second sealing resin oppose each other in row units.

According to the aforementioned configuration, as a result of the first sealing resin and the second sealing resin being arranged in the cavities in the cavity circuit substrate such that the first sealing resin and the second sealing resin oppose each other in row units, the first sealing resin and the second sealing resin can be arranged in the desired cavities at the same time.

It is thereby possible to shorten the time required for the entirety of the sealing process compared to the case where the first sealing resin and the second sealing resin are arranged in the cavities separately.

The present invention is not restricted to the aforementioned embodiments, various alterations are possible within the scope indicated in the claims, and embodiments obtained by appropriately combining the technical means disclosed in each of the different embodiments are also included within the technical scope of the present invention. In addition, novel technical features can be formed by combining the technical means disclosed in each of the embodiments.

INDUSTRIAL APPLICABILITY

The present invention can be suitably used in an illumination device provided with a light-emitting device in which LED chips are used.

REFERENCE SIGNS LIST

1*a* Open reel
10 Multi-cavity circuit substrate
12 Cavity
13 LED
13A LED
14 Package resin
14*a*/14*b* Reflective surface
14*c* Partition
15 Wire
16 LED chip (light-emitting element)
17 Sealing resin 18 Phosphor
19 Phosphor
22 Lead frame
22a Extended portion
23 First lead electrode portion
23c Partition
24 Second lead electrode portion
28 Phosphor
29 Phosphor
31 LED package substrate
32 First cut plate
33 First porous plate
40 Phosphor-containing sealing resin
51 Heater plate
52 First cut plate
52a Cut plate through hole
53 First porous plate
53a Porous-plate through hole
54 Heater block
54a Opening
55 Plunger
56 Second porous plate
56a Porous-plate through hole
61 First reel
62 Second reel
63 Plate
63a Through hole
63b Through hole
D Dimension
X1 Region
X2 Region
Y1 Region
Y2 Region
Y3 Region
Y4 Region
d Dimension

The invention claimed is:

1. A method for manufacturing a light-emitting device in which a plurality of chips is housed in a single package, comprising:
   a first arrangement step in which, in a cavity circuit substrate on which light-emitting elements are mounted in a plurality of cavities that open upward and are provided in rows and columns, a solid-state first sealing resin including a phosphor is arranged in one of at least two of the cavities that form one package;
   a second arrangement step in which a solid-state second sealing resin that is different from the first sealing resin is arranged in the other one of the at least two cavities;
   a melting step in which the first sealing resin arranged in the first arrangement step and the second sealing resin arranged in the second arrangement step are heated and thereby melted; and
   a curing step in which the first sealing resin and the second sealing resin melted in the melting step are cured; wherein
   in the first arrangement step and the second arrangement step, the first sealing resin and the second sealing resin are arranged in the plurality of cavities in the cavity circuit substrate such that the first sealing resin and the second sealing resin oppose each other in row units;
   each of the first sealing resin and the second sealing resin includes a silicone resin;
   a viscosity of the silicone resin reversibly changes at a temperature range from a room temperature to a temperature lower than a secondary cross-linking temperature; and
   the silicone resin hardens at the secondary cross-linking temperature or higher.

2. The method for manufacturing a light-emitting device according to claim 1, wherein:
   in the first arrangement step, the first sealing resin is arranged in the cavities via through holes formed in a first porous plate, and
   in the second arrangement step, the second sealing resin is arranged in the cavities via through holes formed in a second porous plate.

3. The method for manufacturing a light-emitting device according to claim 2, wherein:
   in the first porous plate, the through holes corresponding to the cavities in the cavity circuit substrate are formed in a first group, and
   in the second porous plate, the through holes corresponding to the cavities in the cavity circuit substrate are formed in a second group that is different from the first group.

4. The method for manufacturing a light-emitting device according to claim 1, wherein:
   in the first arrangement step and the second arrangement step, the first sealing resin and the second sealing resin are fed out from a first reel onto which the first sealing resin is wound and a second reel onto which the second sealing resin is wound and are cut to a prescribed length.

* * * * *